(12) United States Patent
Fang et al.

(10) Patent No.: US 7,560,038 B2
(45) Date of Patent: Jul. 14, 2009

(54) THIN FILM FORMING METHOD AND SYSTEM

(75) Inventors: Hongxin Fang, Hong Kong (CN); Hongtao Ma, Dongguan (CN); Baiqing Zhang, Dongguan (CN); Baohua Chen, Dongguan (CN); Somen Choudhury, Hong Kong (CN)

(73) Assignee: SAE Magnetics (H.K.) Ltd., Kwai Chung, N.T., Hong Kong (CN)

( * ) Notice: Subject to any disclaimer, the term of this patent is extended or adjusted under 35 U.S.C. 154(b) by 159 days.

(21) Appl. No.: 10/945,873

(22) Filed: Sep. 22, 2004

(65) Prior Publication Data
US 2006/0060559 A1    Mar. 23, 2006

(51) Int. Cl.
*B44C 1/22* (2006.01)
*C23F 1/00* (2006.01)
*C23C 16/00* (2006.01)

(52) U.S. Cl. .......................... 216/22; 216/37; 118/715; 156/345.3

(58) Field of Classification Search ...................... None
See application file for complete search history.

(56) References Cited

U.S. PATENT DOCUMENTS

| 5,492,605 A | * | 2/1996 | Pinarbasi ............... 204/192.11 |
| 6,132,805 A | * | 10/2000 | Moslehi ................... 427/248.1 |
| RE37,294 E | * | 7/2001 | Knapp et al. ................ 427/534 |

* cited by examiner

*Primary Examiner*—Allan Olsen
(74) *Attorney, Agent, or Firm*—Brinks Hofer Gilson & Lione

(57) ABSTRACT

A thin-film forming method, which includes the steps of: (1) holding at least one object in a chamber; (2) depositing a film-forming material on the object; (3) etching the forming material while depositing is conducted. In the present invention, the depositing and etching are controlled to simultaneously conduct. The invention also disclose a system for performing the method.

9 Claims, 6 Drawing Sheets

THIN FILM FORMING METHOD AND SYSTEM

FIELD OF THE INVENTION

The present invention is related to a method and system of forming a thin film layer, a protective layer, and a friction-free layer, and more particularly to a method and system for forming a protective layer over a magnetic device thereon.

BACKGROUND OF THE INVENTION

At present, magnetic devices, such as magnetic read/write heads, magnetic disks, are being widely used in data storage industry. Referring to FIG. 4, a typical magnetic read/write head, such as magneto-resistance (MR) head, generally comprises a substrate 34, shields 33, a MR element 35, a coil 32 and a yoke 31. Referring to FIG. 6, a typical magnetic disk has a substrate 10, a buffer layer 20, and a magnetic layer 30. Both above magnetic devices have some important elements, such as shield 33, MR element 35, yoke 31, magnetic layer 30, which are made of functional materials, and most of the functional materials are kinds of metal, i.e. Ni, Fe, Mn, Pt, Au, Co, Ti, Cu. Some of these metal materials are very prone to be corroded or damaged. Therefore, a protective film (overcoat) is used for preventing these elements from being corroded or damaged In addition, surface recording density (areal density) of hard disk drivers (HDDs) has been continuously increased since last few years. The increase of areal density demands for higher signal intensity and lower flying height. Accordingly, it is also required for a thinner overcoat, for example, an ultra thin overcoat (i.e. equal or less than 3 nm) will be required for the magnetic read/write head to achieve a higher areal density (i.e. greater than 120 Gb/inch$^2$) in the near future. Correspondingly, lower flying height with a higher rotating speed requires excellent properties of the overcoat, such as hardness, conductivity and tribology properties.

To form an overcoat for satisfying the above-mentioned requirements, a lot of forming methods have been used. Currently, the most popular methods for forming overcoats on magnetic heads are electron cyclotron resonance chemical vapor deposition (ECR CVD) and direct or secondary ion beam deposition (IBD). However, these methods have arrived at a stage where their limitation to scale down a thickness of overcoat is clearly visible, for the following reasons. One reason is that some important elements of magnetic device, such as the read/write element material, yoke and shields, become more and more sensitive to corrosion, which are aimed to have a gradually increased magnetic flux density. Another reason is that these methods use hydrocarbon as precursor, so the formed overcoat has some extent of hydrogen content (5%~50%, atm %) and many defects (such as vacancies, or even pin hole) are formed thereon when the overcoat becomes thinner. These defects show up in the course of manufacturing, application or reliability tests for magnetic devices.

Another problem associated with these methods is that the high deposition rate results in a very short time to form an ultra thin overcoat (i.e. equal or less than 3 nm), and this makes the overcoats formed on the magnetic devices in one batch non-uniform. Additionally, the current coating machines usually utilize a shutter for blocking ion beam. The shutter normally takes about two seconds to open or close. During the course of opening or closing the shutter, there are still some ion beams bombarding the magnetic devices, which also contributes to the non-uniformity of the overcoats formed on one batch magnetic devices.

Hence it is desired to provide a method and system for forming thin film over magnetic devices which can overcome the foregoing drawbacks of the prior art.

SUMMARY OF THE INVENTION

A main feature of the present invention is to provide a method and system of forming thin film to achieve well-uniformity.

To achieve the above-mentioned feature, a thin film forming method of the present invention, comprises the steps of: (1) holding at least one object in a chamber; (2) depositing a forming material on the object; and (3) etching the forming material while depositing is conducted. In the present invention, the depositing and etching are controlled to be conducted simultaneously. The depositing is that placing a target for forming a film and irradiating ion beam to bombard the target. The etching comprises the steps of: (1) making an atmosphere of inert or reactive gas at a predetermined pressure in a chamber; (2) ionizing the atmosphere to generate etching beam to bombard the object.

A system of the present invention comprises a chamber to form thin film, a positioning tool to hold an object in the chamber, a disposing conductor to conduct deposition on the object, an etching conductor to conduct etching the object; and a controller to control irradiation timing of the both conductors. In the present invention, the controller is a shutter which is placed in front of the object to open when both of irradiations are stable.

As an embodiment of the present invention, a thin film forming method comprises the steps of: (1) holding at least one object in a chamber; (2) the chamber is pumped to a predetermined pressure and then an inert or reactive gas is introduced into an etching source; (3) the inert or reactive gas is ionized and extracted by a grid of the etching source to generate an etching beam; (4) a first deposition source is turned on to generate a first deposition beam; (5) the deposition and etching beams are blocked by a substrate shutter mounted in front of the object(s); (6) the substrate shutter is opened when the deposition and etching beams are both stable, and the deposition and etching beams are bombarding the object(s) simultaneously to form a first film thereon. In the present invention, a second film can also be formed on the first film by a second deposition source bombarding the object.

In the present invention, the first deposition source can be ion beam deposition (IBD) source, ion beam sputter deposition (IBSD) source, ion cluster beam (ICB) deposition source, or ion beam assisted deposition (IBAD) source.

By depositing a forming material on an object while etching the forming material, the method and system not only improves the adhesion and coverage properties of the film formed on the object, but also decrease the deposition rate significantly and accordingly extend the deposition time, then the uniformity of the protective film formed on one-batch objects can be improved significantly. A lower deposition rate also minimize the influence of opening and closing the shutter on the uniformity of the protective films. In addition, the method also overcome the current thickness limitation (i.e. equal or more than 3 nm) of the protective film with superior reliability of the conventional film forming method.

For the purpose of making the invention easier to understand, one particular embodiment thereof will now be described with reference to the appended drawings in which:

DETAILED DESCRIPTION OF THE INVENTION

A thin film forming method of the present invention comprises the steps of: (1) holding at least one object in a chamber; (2) depositing a film-forming material on the object; and (3) etching the film-forming material while depositing is conducted. In the present invention, the depositing and etching are conducted simultaneously. The depositing step comprises placing a target for forming a film and irradiating ion beam to bombard the target. The etching step comprises the steps of: (1) providing an atmosphere of inert or reactive gas at a predetermined pressure in a chamber; and (2) ionizing the atmosphere to generate etching beam to bombard the object.

Figure 1:
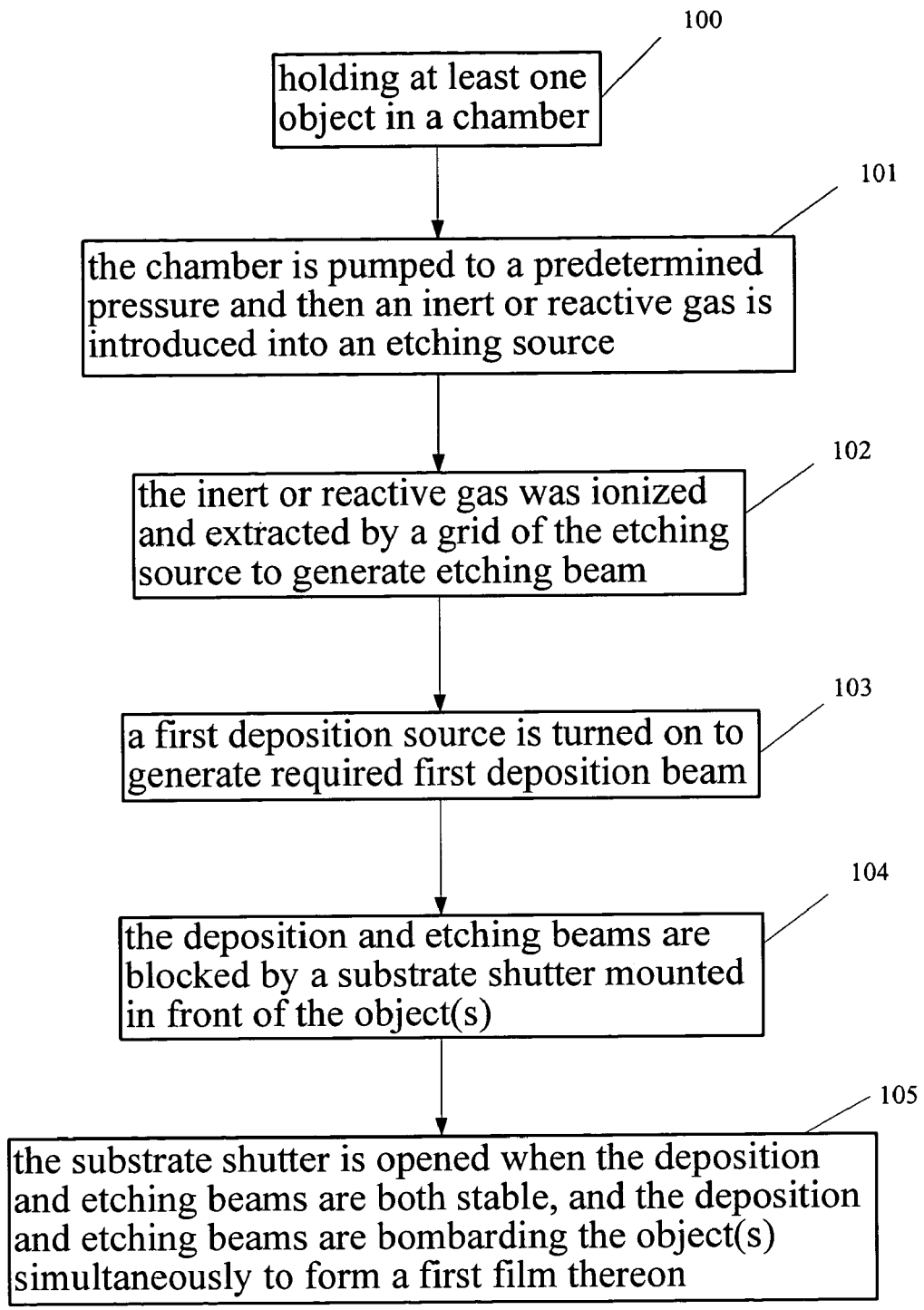
FIG. 1 is a flow chart of a thin film forming method of an embodiment of the present invention.

Referring now to the drawings in detail, FIG. 1 shows a flow chart of a thin film forming method according to an embodiment of the present invention. The method comprises the following steps: (1) holding at least one object in a chamber (Step 100); (2) the chamber is pumped to a predetermined pressure and then an inert or reactive gas is introduced into the chamber, as an etching source (Step 101); (3) the inert or reactive gas was ionized and extracted by a grid of the etching source to generate etching beam (Step 102); (4) a first deposition source is turned on to generate a first deposition beam (Step 103); (5) the deposition and etching beams are blocked by a substrate shutter mounted in front of the object(s) (Step 104); (6) the substrate shutter is opened when the deposition and etching beams are both stable, and the deposition and etching beams are bombarding the object(s) simultaneously to form a first film thereon (Step 105).

In the present invention, a second film can be formed on the first film by a second deposition source bombarding the object(s). The second deposition source is an ion beam source using a hydrocarbon as precursor with the aid of another ion beam source, or an microwave ion source using hydrocarbon as precursor with the aid of another ion beam source, and accordingly the second film is a diamond like carbon film. In step (103), the first deposition beam is created by using an ion beam source to bombard a silicon (or other material, such as graphite) target, and the first film is a silicon (or other material, such as carbon) film. In step (101), the etching source can be radio frequency inductive plasma source, or a Kaufman ion source, and the grid can be two-platter structure or three-platter structure, preferably three-platter structure, with concave, convex or flat surface. A grid with three-platter structure comprises a beam grid, a suppressor grid and a ground grid.

In step (101), the inert or reactive gas is introduced into the etching source by a mass flow controller (MFC), and the chamber is generally pumped to a pressure less than $1 \times 10^6$ Torr, before the inert or reactive gas is introduced. After the inert or reactive gas is introduced, the etching source is ignited and after a while the plasma is stabilized. Then the first deposition source starts accordingly. In the present invention, each source has a shutter mounted in front thereof, and when the etching source and the first deposition source both attain a stable state of plasma, the shutters for both the sources are opened to etch and coat the objects simultaneously.

Figure 4:
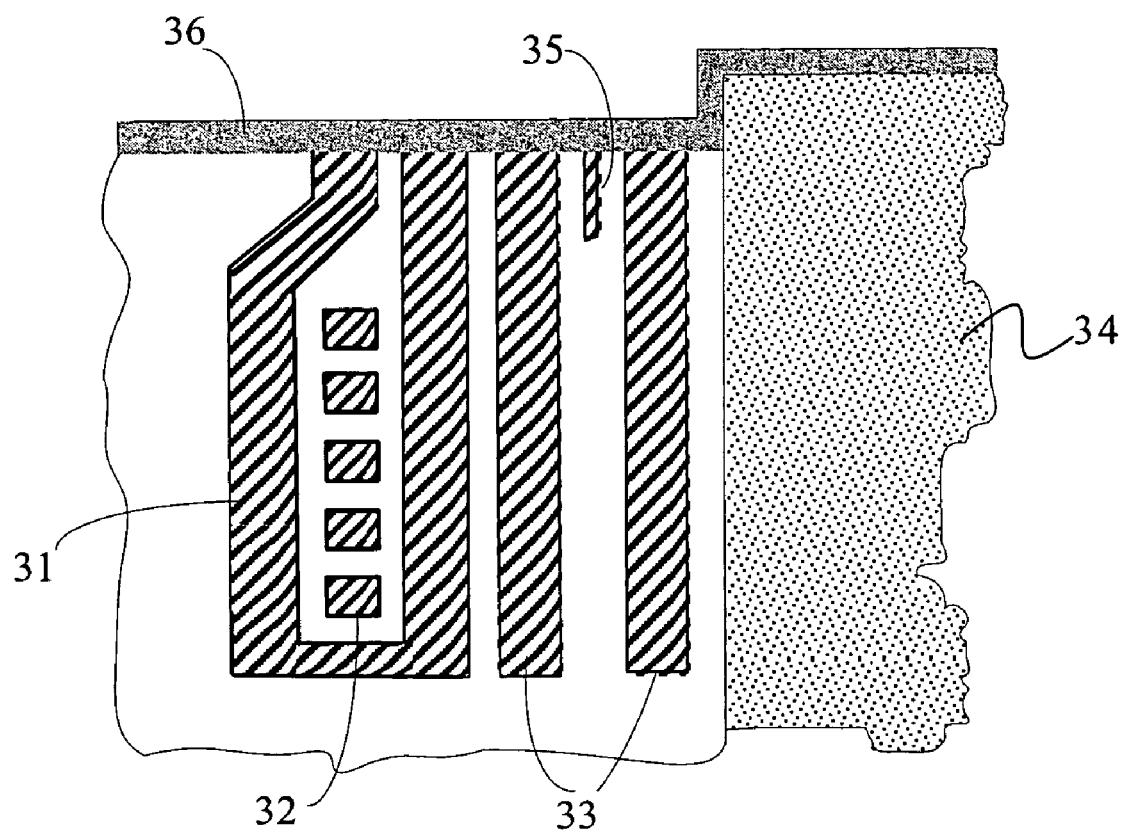
FIG. 4 is a cross-sectional view of a pole (indicated with an oval line IV) of the magnetic head of FIG. 3 taken along line A-A, with a protective film formed thereon by the method of the present invention.
Figure 5:
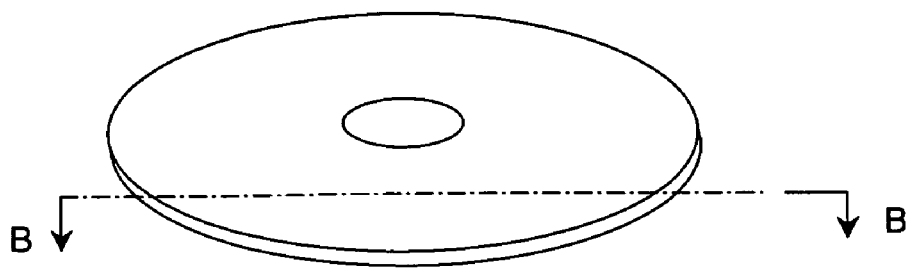
FIG. 5 is a perspective view of a magnetic disk.
Figure 6:
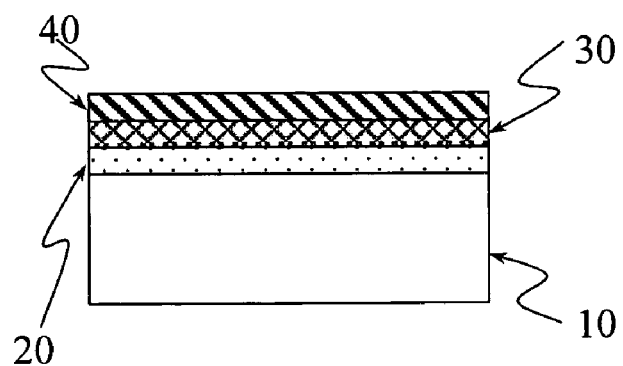
FIG. 6 is a cross-sectional view of the magnetic disk of FIG. 5 taken along line B-B, with a protective film formed thereon by the method of the present invention.

In the present invention, both the etching source and the deposition sources are adjusted to an optimized power. The ion energy of the etching source is normally ranged from 60 ev to 200 ev, to avoid any damage to the elements of the object (such as the MR element 35 when the object is a magnetic head, see FIG. 4). The first deposition source parameters can be adjusted without any constraint according to the deposition rate and uniformity requirement.

The following paragraphs illustrates an embodiment of the present invention and describes the present invention in more detail.

Figure 2:
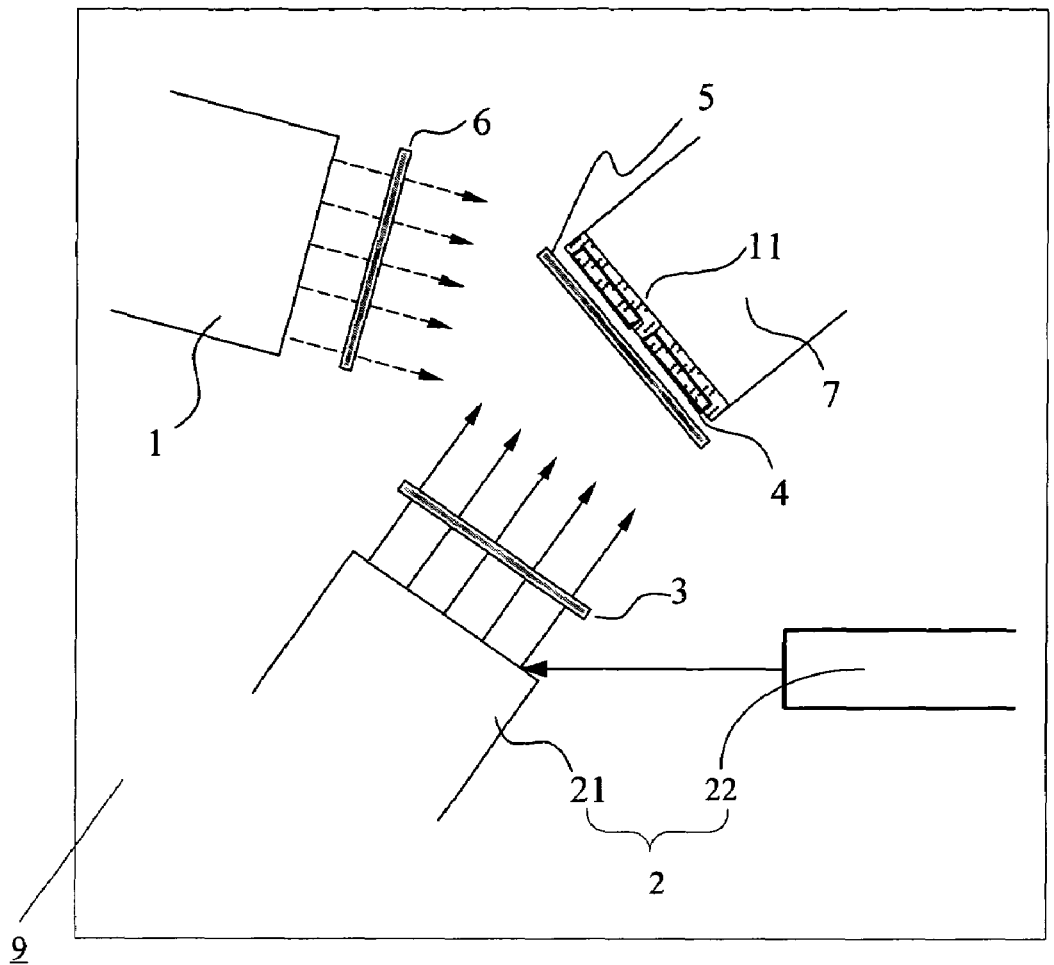
FIG. 2 is a schematic view of a thin film forming system according to an embodiment of the present invention.
Figure 3:
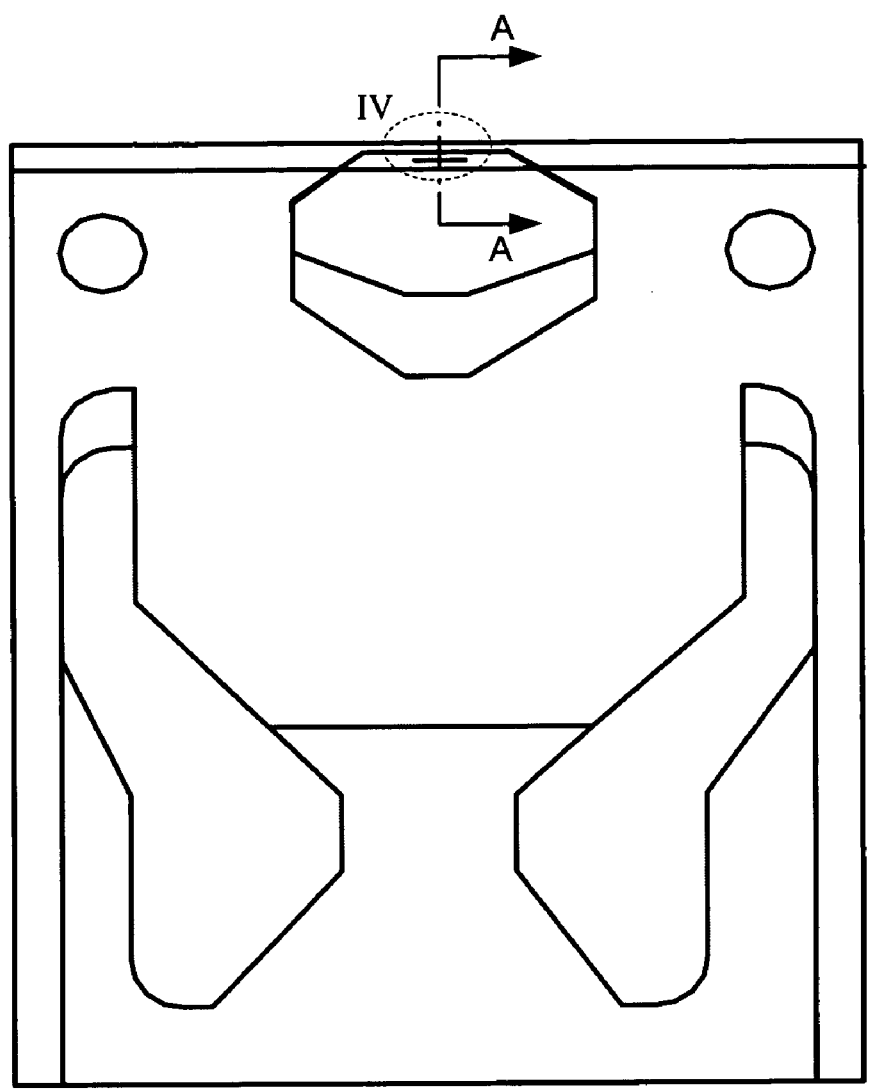
FIG. 3 is a top view of a magnetic head.

Referring to FIG. 2, first, a pallet 11 loaded with objects 4 is put in a chamber 9 by a robot and fixed on a fixture 7, the pallet 11 is also tilted as required. In the present invention, an etching source 1 and a first deposition source 2 (a secondary ion beam deposition system in the embodiment) are provided for coating the magnetic devices 4, and two shutters 6, 3 are mounted in front thereof, respectively. The etching source 1 can generate etching beam (argon ion beam in this embodiment) and the first deposition source 2 can generate a first deposition beam. A substrate shutter 5 is also provided in front of the magnetic devices 4 to prevent them from being coated when first deposition and etching beams are not stable.

The coating process in the chamber 9 can be carried as follows:

Step 1 Surface Cleaning

First, the etching source 1 is turned on to generate argon ion beam under the following condition: the flow rate of argon gas is 15 SCCM, the RF ignite power is 350 watts (W), the beam voltage is 120 volts and the beam current is 100 milliamperes, the suppressor voltage is 200 volts, the incidence angle of the argon ion beam to the objects 4 is 60° C.

After 30 seconds, the shutter 6 and the substrate shutter 5 are opened when the ion beam is stable. Then the objects 4 on the pallet 11 are etched for 30~60 seconds by the argon ion beam until the surfaces of the objects 4 are clean. After that time, the substrate shutter 5 is closed, and the etching source 1 is kept on without any change of the above-mentioned condition.

Step2 Coating and Forming a First Film

Here silicon film is selected as the first film and the secondary ion beam deposition system 2 used for amorphous silicon deposition. The secondary ion beam deposition system 2 comprises an ion beam source 22 and a silicon target 21. The working condition of the ion beam source 22 used for bombing deposition target (silicon target) is set as follows: the flow rate of argon gas is 10 SCCM, the RF ignite power is 400 watts, the beam voltage is 500 volts, the beam current is 300 milliamperes, the suppressor voltage is 300 volts, the incidence angle of argon ion beam from the ion beam source 22 to the silicon target 21 is 35° C.

After 30 seconds, the shutter 3 and the substrate shutter 5 are opened when the ion beam is stable. Simultaneously, the shutter 6 is also opened and then the argon ion beam from the etching source 1 in step 1 is bombarding the surfaces of the objects 4 to densify the silicon film. The coating process is continued for about 30 seconds to 50 seconds until the silicon film reaches a thickness of about 1 nm. After that time the shutters 6, 3 and the substrate shutter 5 are closed and the secondary ion beam deposition system and the etching source 1 are turned off.

Step 3 Coating and Forming a Second Film

In this step, for example, ethene gas is used to form a second film, such as a diamond like carbon film (DLC film). The DLC film coating uses the same source as the etching source 1 in step 1 and the conditions in step 1 remain unchanged, except that the gas line is changed from argon to ethene with a flow rate of 80 SCCM. After the modified etching source is turned on for 30 seconds, the shutter 6 and the substrate shutter 5 are opened when the ion beam is stable. Then, the ionized ethene segment is deposited on the silicon film of the objects 4 to form the DLC film. After that, the shutter 6 and the substrate shutter 5 are closed and the source is turned off. Then, the coated objects are formed. When the object 4 is a magnetic head or magnetic disk, a protective film 36 or 40 formed thereon as shown in FIGS. 3-4 and 5-6, respectively.

In all of the above-mentioned steps, a neutralizer may be used to avoid accumulating charges on the objects 4. In addition, in the present invention, the pallet 11 is rotating at a speed of 15 rpm.

Figure 7:
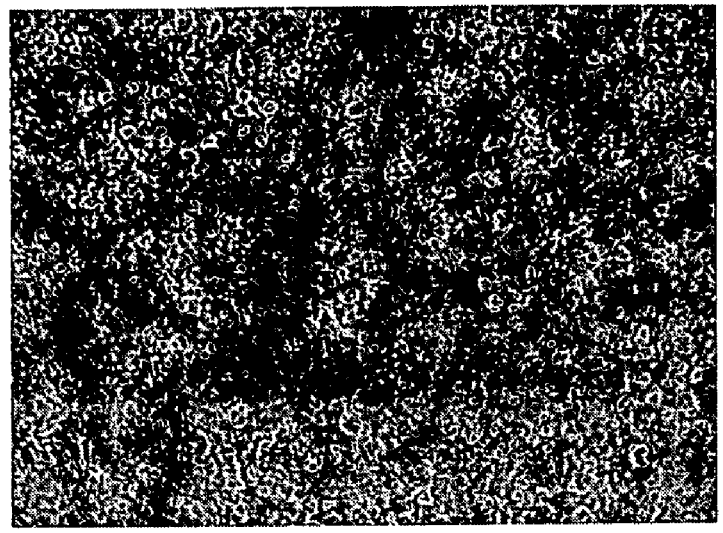
FIG. 7 is a scanning electron microscope (SEM) picture of a protective film formed by conventional method after acid dipping test.
Figure 8:
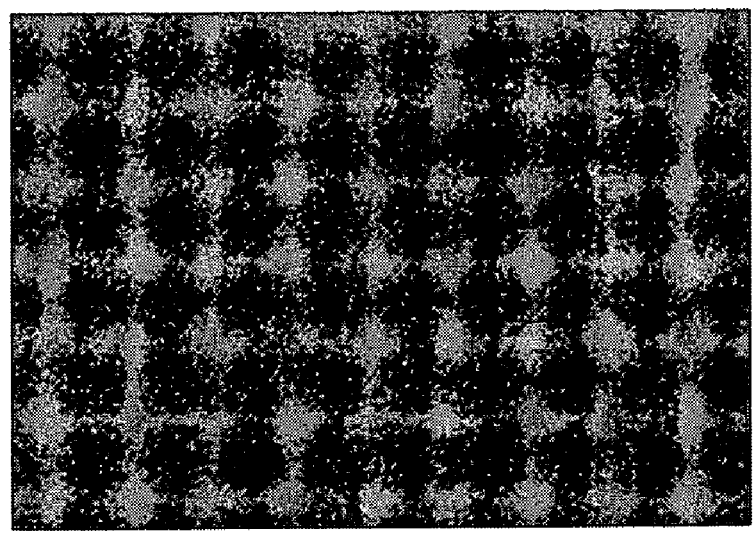
FIG. 8 is a scanning electron microscope (SEM) picture of a protective film formed by the method of the present invention after acid dipping test.

Referring to FIGS. 7 and 8, the protective film formed on the object by the thin film forming method of the present invention shows a better performance, such as surface coverage, in acid dipping test, when compared with a protective film with the same thickness formed by conventional film forming method. Test results also indicate that the protective film formed by the thin film forming method of the present invention can be reduced its thickness to about 2.5 nm in an acid dipping test without any obvious corrosion. However, the thickness of the protective film formed by conventional film forming method can only be reduced to a thickness of about 4 nm to attain the same result.

In the present invention, the argon gas can be replaced by other inert gases or reactive gases, the first deposition source 2 also can be directly an ion beam deposition (IBD) source, ion beam sputter deposition (IBSD) source, ion cluster beam (ICB) deposition source, or ion beam assisted deposition (IBAD) source. Because the above-mentioned deposition sources are well known to persons skilled in the art, a detailed description of such deposition sources is omitted herefrom.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A film forming method comprises: (1) holding at least one object in a chamber; (2) depositing a film-forming material on the object; and (3) etching the film-forming material while depositing is conducted,
    wherein the depositing step (2) comprises (a) providing a target material for forming a film, (b) irradiating an ion beam to bombard the target material to form a first deposition beam, and (c) bombarding the object with the first deposition beam, and
    wherein the etching step comprises (i) providing an atmosphere of inert or reactive gas at a predetermined pressure in a chamber; and (ii) ionizing the atmosphere to generate an etching ion beam to bombard the object, and
    wherein the first deposition beam and the etching ion beam bombard the object along different paths, and
    wherein a second film is deposited on the film by a second deposition source bombarding the object, the second deposition source is an ion beam source using a hydrocarbon as precursor with the aid of another ion beam source, and accordingly the second film is a diamond like carbon film.

2. The method of claim 1, wherein the target material is silicon and the film is correspondingly a silicon film.

3. A film forming method comprises: (1) holding at least one object in a chamber; (2) pumping the chamber to a predetermined pressure, and introducing inert or reactive gas into an etching source of the chamber, (3) ionizing and extracting the inert or reactive gas by a grid to generate an etching ion beam; (4) turning on a first deposition source to generate a first deposition beam while the deposition and etching ion beams are blocked by a substrate shutter mounted in front of the object; (5) opening the substrate shutter when the deposition and etching ion beams are both stable, to allow the deposition and etching ion beams to bombard the object simultaneously, thereby forming a first film thereon;
    wherein the deposition and etching ion beams bombard the object along different paths, and
    wherein a second film is deposited on the film by a second deposition source bombarding the object, the second deposition source is an ion beam source using a hydrocarbon as precursor with the aid of another ion beam source, and accordingly the second film is a diamond like carbon film.

4. The method of claim 3, wherein the first deposition beam is created by using an ion beam source to bombard a silicon target, and the first film is correspondingly a silicon film, wherein the etching source is a radio frequency inductive plasma source.

5. The method of claim 3, wherein the inert or reactive gas is introduced into the etching source by a mass flow controller (MFC), and the predetermined pressure value is less than $1 \times 10^6$ Torr.

6. The method of claim 3, wherein an ion energy of the etching source ranges from about 60 eV to 200 eV.

7. The method of claim 3, wherein the grid is a two-platter structure or three-platter structure.

8. A method of claim 7, wherein the grid is a three-platter structure with concave, convex or flat surface.

9. The method of claim 7, wherein the grid is a beam grid.

* * * * *

UNITED STATES PATENT AND TRADEMARK OFFICE
CERTIFICATE OF CORRECTION

PATENT NO. : 7,560,038 B2 Page 1 of 1
APPLICATION NO. : 10/945873
DATED : July 14, 2009
INVENTOR(S) : Hongxin Fang et al.

It is certified that error appears in the above-identified patent and that said Letters Patent is hereby corrected as shown below:

In column 6, claim 8, line 59, after "with concave, convex or" replace "fiat" with --flat--.

Signed and Sealed this

Twentieth Day of October, 2009

David J. Kappos
*Director of the United States Patent and Trademark Office*